(12) United States Patent
Saito

(10) Patent No.: US 6,730,946 B2
(45) Date of Patent: May 4, 2004

(54) SEMICONDUCTOR DEVICE

(75) Inventor: Akira Saito, Kanagawa (JP)

(73) Assignee: Sony Corporation (JP)

( * ) Notice: Subject to any disclaimer, the term of this patent is extended or adjusted under 35 U.S.C. 154(b) by 108 days.

(21) Appl. No.: 10/055,188

(22) Filed: Jan. 25, 2002

(65) Prior Publication Data

US 2002/0100940 A1 Aug. 1, 2002

Related U.S. Application Data

(62) Division of application No. 29/139,247, filed on Mar. 28, 2001, now Pat. No. Des. 474,185.

(30) Foreign Application Priority Data

Jan. 29, 2001 (JP) .................................... P2001-020039

(51) Int. Cl.[7] .............................................. H01L 27/10
(52) U.S. Cl. ...................................... 257/207; 257/208
(58) Field of Search ................................ 257/207, 208, 257/211

(56) References Cited

U.S. PATENT DOCUMENTS

| | | | | |
|---|---|---|---|---|
| 5,148,263 A | * | 9/1992 | Hamai | 257/758 |
| 5,949,098 A | * | 9/1999 | Mori | 257/211 |
| 6,324,677 B1 | * | 11/2001 | Fischer et al. | 716/6 |

* cited by examiner

*Primary Examiner*—Phat X. Cao
(74) *Attorney, Agent, or Firm*—Rader, Fishman & Grauer PLLC; Ronald P. Kananen

(57) ABSTRACT

Provided is a semiconductor device capable of reducing its size, increasing density, preventing a deterioration in circuit characteristics. And increasing flexibility in wiring design. The semiconductor device comprises a chip core region and an IO region on a semiconductor substrate. In the chip core region, a large number of circuits are arranged. In the IO region, a ring wiring of a laminated structure with a top layer corresponding to a first potential, and a bottom layer corresponding to a second potential is provided. The top layer of the ring wiring and the circuits are connected via first connecting lines, and the bottom layer and the circuits are connected via second connecting lines, so electric power is supplied to the circuits.

6 Claims, 10 Drawing Sheets

SEMICONDUCTOR DEVICE

This application is a divisional application of Ser. No. 29/139,247 filed Mar. 28, 2001 now U.S. Pat. No. Des. 474,185 now pending.

BACKGROUND OF THE INVENTION

1. Field of the Invention

The present invention relates to a semiconductor device such as memory or microprocessor.

2. Description of the Related Art

Conventionally, a semiconductor device such as memory and microprocessor comprises a plurality of circuits provided on a semiconductor substrate. Each of the circuits is a combination of a plurality of transistors etc. so as to carry out a certain process. Therefore, the circuits are also called function blocks.

FIG. 11 shows a plane view of an example of a conventional semiconductor device. The semiconductor device comprises a plurality of circuits 102, each of which has a specific function, mounted on, for example, a rectangular semiconductor substrate 101. The semiconductor substrate 101 includes an Input/Output region (hereinafter referred to as "IO region") 103, which is formed with a predetermined width along the outer region of the substrate 101, and a chip core region 104 surrounded by the IO region 103. The circuits 102 are mounted in the chip core region 104.

FIG. 12 shows an enlarged view of the IO region 103 and its vicinity in the semiconductor device shown in FIG. 11. The IO region 103 includes signal cells 103C for transmitting signals between each of the circuits 102 and external devices, as well as first power supply cells 103A and second power supply cells 103B for supplying electric power to each of the circuits 102. The first power supply cells 103A and the second power supply cells 103B are connected to external devices (not shown) so as to obtain a first potential (for example, a ground potential) and a second potential, respectively.

In order to distribute the electric power supplied via the first power supply cells 103A and the second power supply cells 103B throughout the semiconductor device, the IO region 103 includes a pair of ring wirings arranged around the chip core region 104, that is, a first trunk 105 and a second trunk 106. The first trunk 105 and the second trunk 106 are formed on the first power supply cells 103A, second power supply cells 103B and signal cells 103C so as to be at the same level with respect to the semiconductor substrate 101 (that is, on the same surface). The first trunk 105 and the second trunk 106 are not shown in FIG. 11.

As the first trunk 105 and the second trunk 106 are formed on the same surface, it is difficult to expand their areas, so necessary power supply cannot be obtained. Therefore, the chip core region 104 further includes another pair of ring wirings, that is, a third trunk 107 and a fourth trunk 108. The third trunk 107 and the fourth trunk 108 are connected to the first power supply cells 103A and the second power supply cells 103B, respectively, so as to have the first potential and the second potential, respectively. As shown in FIG. 11, the third trunk 107 and the fourth trunk 108 extend so as to be arranged around each of the circuits 102 in the chip core region 104, and are connected to each of the circuits 102 via branch lines 109 and 110.

However, such a conventional semiconductor device must have the third trunk 107 and the fourth trunk 108 in the chip core region 104, so it is difficult to improve the packing density of circuits 102 in the chip core region 104, which leads to an obstacle to downsizing and higher integration of the semiconductor device.

Further, as the third trunk 107 and the fourth trunk 108 must be arranged in the chip core region 104, there is a problem that the conventional semiconductor device has a low degree of flexibility in wiring design.

Moreover, as power supply paths from the first power supply cells 103A and the second power supply cells 103B to each of the circuits 102 are long, a large voltage drop occurs, which results in a deterioration in circuit characteristics.

SUMMARY OF THE INVENTION

The present invention has been achieved in light of the foregoing problems. It is an object of the invention to provide a semiconductor device capable of reducing its size, increasing its packing density, preventing a deterioration in circuit characteristics, and increasing flexibility in wiring design.

A semiconductor device according to the invention comprises a substrate including a first region and a second region having a ring shape arranged around the first region; a circuit provided in the first region of the substrate and having a predetermined function; and a power supply wiring provided in the second region of the substrate to supply electric power to the circuit, and having a laminated structure with a first power supply layer corresponding to a first potential, and a second power supply layer corresponding to a second potential.

In the semiconductor device according to the invention, as the power supply wiring of a laminated structure includes the first power supply layer and the second power supply layer, compared with a case where the first and second power supply layers are arranged on the same surface, each area of the first and second power supply layers can be expanded, so a enough supply capability of electric power can be obtained without providing additional trunks.

DETAILED DESCRIPTION OF THE PREFERRED EMBODIMENTS

A preferred embodiment of the invention will be described in detail with reference to the accompanying drawings.

<Configuration of Semiconductor Device>

Figure 1:
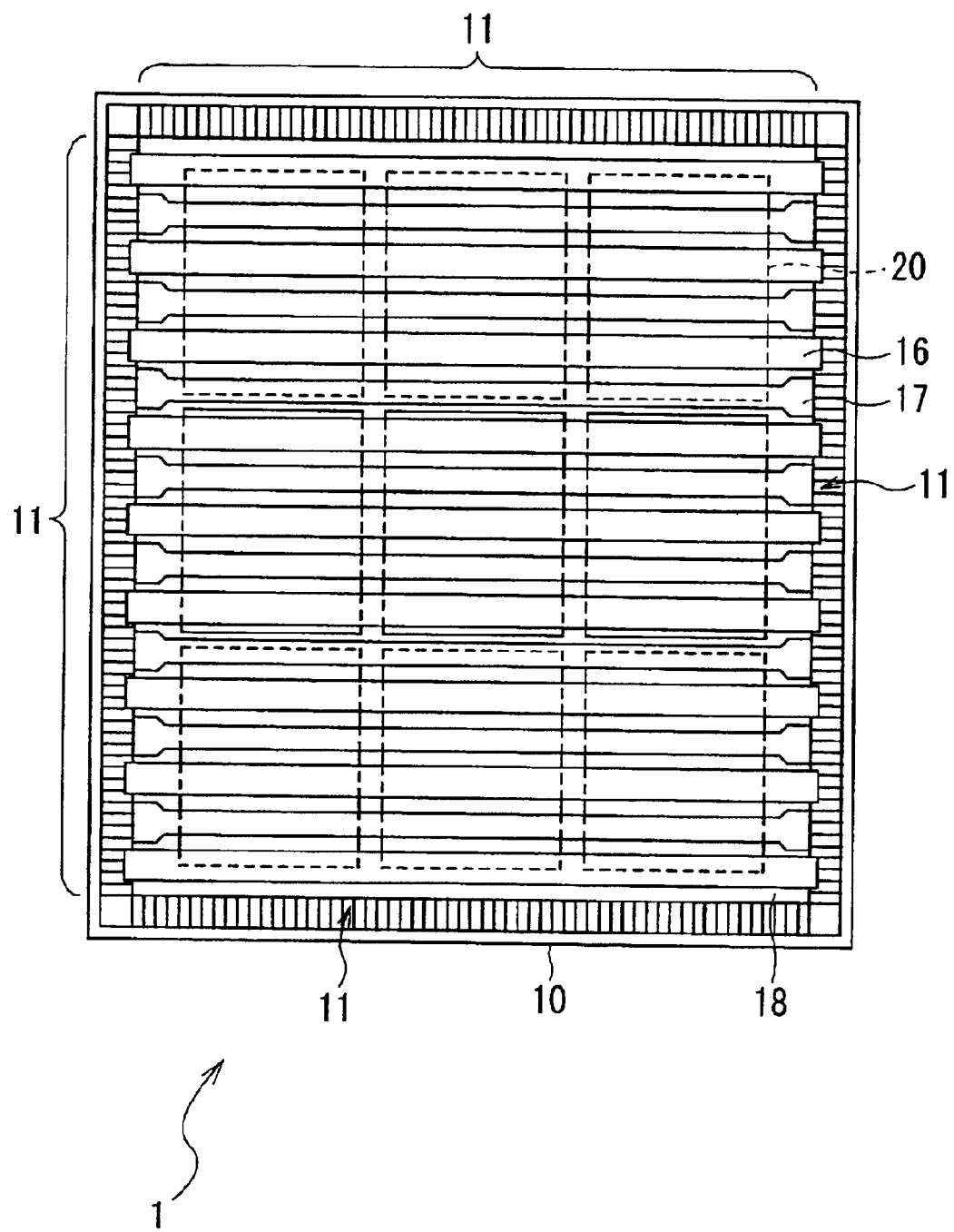
FIG. 1 is a plane view of a semiconductor device according to an embodiment of the invention.

FIG. 1 shows a general configuration of a semiconductor device 1 according to the embodiment of the invention. The semiconductor device 1 is used as, for example, memory or microprocessor. The semiconductor device 1 comprises a rectangular semiconductor substrate 10 made of, for example, Si (silicon). On the surface of semiconductor substrate 10, a plurality of circuits 20, each of which has a specific function, are arranged. The circuits 20 are combinations of a plurality of transistors, so they are also called function blocks. In the semiconductor substrate 10, a region where the circuits 20 are formed is called a chip core region 18.

In the semiconductor substrate 10, a region arranged around the chip core region 18 along the outer region of the semiconductor substrate 10 is called an IO region 11. In the IO region 11, a large number of signal cells 30 (refer to FIG. 2), etc. are arranged to transmit signals between each of the circuits 20 and external devices. The semiconductor substrate 10 corresponds to a specific example of a "substrate" in the invention. The chip core region 18 and the IO region 11 correspond to specific examples of a "first region" and a "second region" in the invention, respectively.

Figure 2:
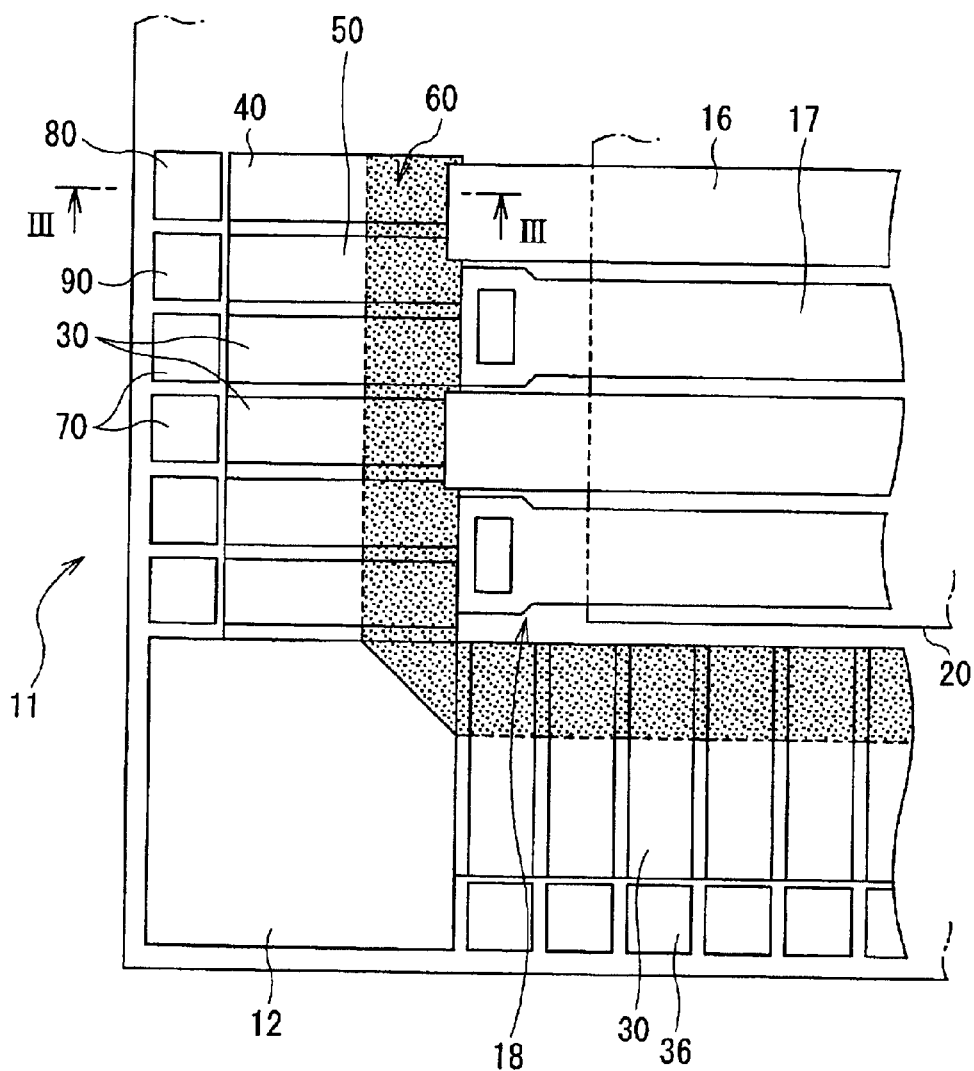
FIG. 2 is an enlarged plane view of a main portion of the semiconductor device shown in FIG. 1.
Figure 3:
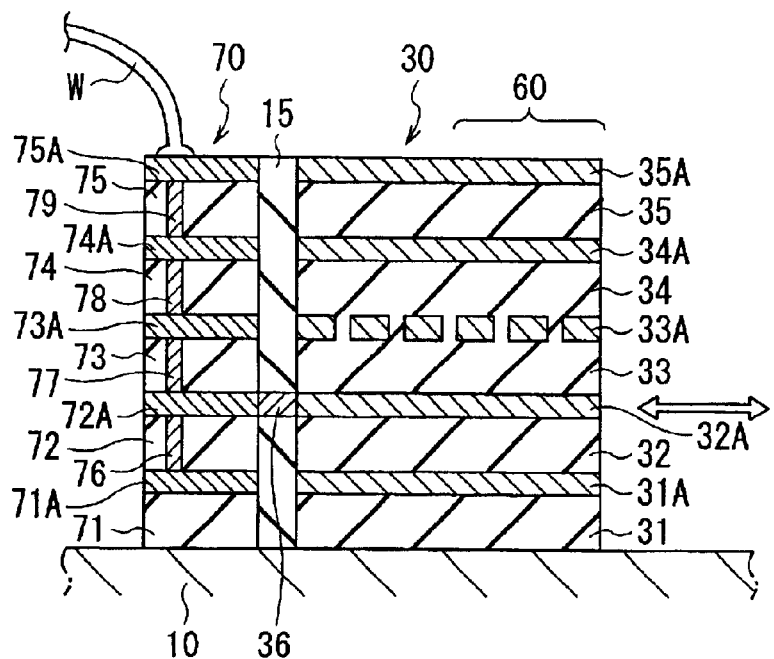
FIG. 3 is a cross sectional view of a signal cell in an IO region of the semiconductor device shown in FIG. 1.

FIG. 2 shows an enlarged view of the IO region 11 and its vicinity in the semiconductor device 1 shown in FIG. 1, and FIG. 3 shows a cross sectional view taken along lines III—III of FIG. 2. As shown in FIG. 2, the IO region 11 includes signal cells 30, first power supply cells 40 for supplying a first potential (for example, ground potential) to the circuits 20, and second power supply cells 50 for supplying a second potential (for example, positive potential) to the circuits 20. On the outside of the signal cells 30, the first power supply cells 40 and the second power supply cells 50 (namely, the outer region of the semiconductor substrate 10), signal pads 70, first pads 80 and second pads 90 for connecting with the external devices are provided, respectively.

As shown in FIG. 3, the signal cell 30 has a five-layer structure with a first layer 31, a second layer 32, a third layer 33, a fourth layer 34 and a fifth layer 35 in order from the semiconductor substrate 10. Each of the layers 31 to 35 is made of an insulating material such as $SiO_2$ (silicon oxide). On the first layer 31, the second layer 32, the third layer 33, the fourth layer 34 and the fifth layer 35, a first-layer wiring 31A, a second-layer wiring 32A, a third-layer wiring 33A, a fourth-layer wiring 34A and a fifth-layer wiring 35A, each of which is made of an electrically conductive material such as Al (aluminum), are formed, respectively. The second-layer wiring 32A is connected to a predetermined circuit 20 in the chip core region 18 refer to FIG. 1) via a signal line (not shown).

Like the signal cell 30, the signal pad 70 has a five-layer structure with a first layer 71, a second layer 72, a third layer 73, a fourth layer 74 and a fifth layer 75 in order from semiconductor substrate 10. Each of the layers 71 to 75 is made of an insulating material such as $SiO_2$. On the first layer 71, the second layer 72, the third layer 73, the fourth layer 74 and the fifth layer 75, a first-layer wiring 71A, a second-layer wiring 72A, a third-layer wiring 73A, a fourth-layer wiring 74A and a fifth-layer wiring 75A, each of which is made of an electrically conductive material such as Al, are formed, respectively. On the top surface of the fifth-layer wiring 75A, a lead W of, for example, Au (gold) for connecting with an external device is fixed.

In the second layer 72 of the signal pad 70, a contact 76 is formed to connect the first-layer wiring 71A with the second-layer wiring 72A, and in the third layer 73, a contact 77 is formed to connect the second-layer wiring 72A with the third-layer wiring 73A. In the fourth layer 74, a contact 78 is formed to connect the third-layer wiring 73A with the fourth-layer wiring 74A, and in the fifth layer 75, a contact 79 is formed to connect the fourth-layer wiring 74A with the fifth-layer wiring 75A The contacts 76 to 79 are made of an electrically conductive material such as Al. Thereby, the first-layer wiring 71A, the second-layer wiring 72A, the third-layer wiring 73A, the fourth-layer wiring 74A and the fifth-layer wiring 75A are at the same potential.

The signal cell 30 is isolated from the signal pad 70 by an insulator as will be described later, although the second-layer wiring 32A of the signal cell 30 and the second-layer wiring 72A of the signal pad 70 are electrically connected with each other via a conductive layer 36 of electrically conductive material.

Therefore, when a signal is transmitted to the fifth-layer wiring 75A of the signal pad 70 via the lead W, the signal is transmitted to the second-layer wiring 32A of signal cell 30 via the second-layer wiring 72A of the signal pad 70 and the conductive layer 36. The signal transmitted to the second-layer wiring 32A of the signal cell 30 is transmitted to a predetermined circuit 20 via the signal line (not shown).

Figure 4:
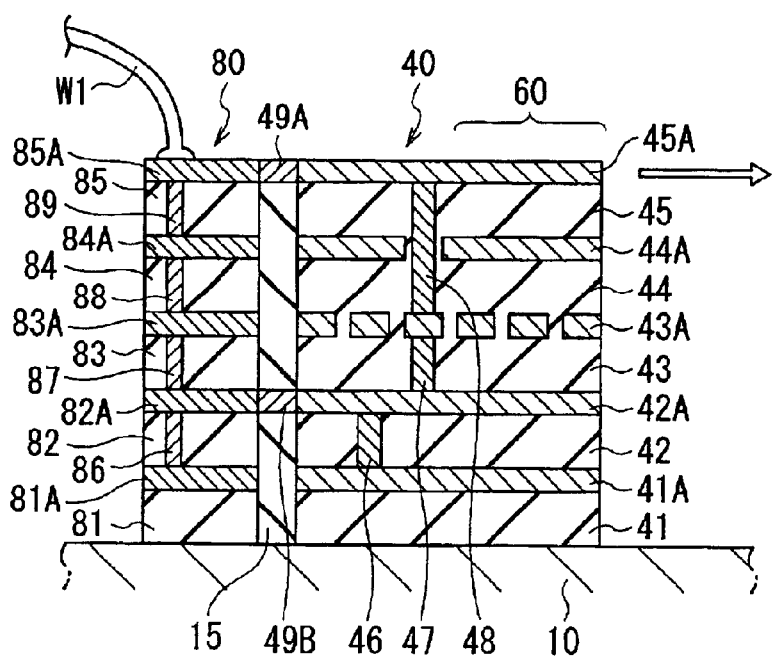
FIG. 4 is a cross sectional view of a first power supply cell in the IO region of the semiconductor device shown in FIG. 1.

FIG. 4 shows a cross sectional view of the first power supply cell 40. Like signal cell 30, the first power supply cell 40 has a five-layer structure with a first layer 41, a second layer 42, a third layer 43, a fourth layer 44 and a fifth layer 45 in order from the semiconductor substrate 10. Each of the layers 41 to 45 is made of an insulating material such as $SiO_2$. On the first layer 41, the second layer 42, the third layer 43, the fourth layer 44 and the fifth layer 45, a first-layer wiring 41A, a second-layer wiring 42A, a third-layer wiring 43A, a fourth-layer wiring 44A and a fifth-layer wiring 45A, each of which made of an electrically conductive material such as Al, is formed, respectively.

Further, in the second layer 42, a contact 46 is formed to connect the first-layer wiring 41A with the second-layer wiring 42A. In the third layer 43, a contact 47 is formed to contact the second-layer wiring 42A with the third-layer wiring 43A. In the fourth layer 44 and the fifth layer 45, a contact 48 is formed to connect the third-layer wiring 43A with the fifth-layer wiring 45A The contact 48 passes through a through hole formed in the fourth-layer wiring 44A, so as not to contact with the fourth-layer wiring 44A. The contacts 46 to 48 are made of an electrically conductive material such as Al. Thereby, the first-layer wiring 41A, the second-layer wiring 42A, the third-layer wiring 43A and the fifth-layer wiring 45A in the first power supply cell 40 are at the same potential.

Like the first power supply cell 40, the first pad 80 has a five-layer structure with a first layer 81, a second layer 82, a third layer 83, a fourth layer 84 and a fifth layer 85 in order from the semiconductor substrate 10. Each of the layers 81 to 85 is made of an insulating material such as $SiO_2$. On the first layer 81, the second layer 82, the third layer 83, the fourth layer 84 and the fifth layer 85, a first-layer wiring 81A, a second-layer wiring 82A, a third-layer wiring 83A, a fourth-layer wiring 84A and a fifth-layer wiring 85A, each of which is made of an electrically conductive material such as Al, is formed, respectively. On the top surface of the fifth-layer wiring 85A, a lead W1 of, for example, Au for connecting with an external device is fixed.

In the second layer 82 of the first pad 80, a contact 86 is formed to connect the first-layer wiring 81A with the second-layer wiring 82A, and in the third layer 83, a contact 87 is formed to connect the second-layer wiring 82A with the third-layer wiring 83A. In the fourth layer 84, a contact 88 is formed to connect the third-layer wiring 83A with the fourth-layer wiring 84A, and in the fifth layer 85, a contact 89 is formed to connect the fourth-layer wiring 84 with the fifth-layer wiring 85A. The contacts 86 to 89 are made of an electrically conductive material such as Al. That is, the first-layer wiring 81A to the fifth-layer wiring 85A in the first pad 80 are at the same potential.

The first power supply cell 40 is isolated from the first pad 80 by the insulator 15, although the fifth-layer wiring 45A of the first power supply cell 40 is connected with the fifth-layer wiring 85A of the first pad 80 by a conductive layer 49A of electrically conductive material Further, the second-layer wiring 42A of the first power supply cell 40 is connected with the second-layer wiring 82A of the first pad 80 by a conductive layer 49B of electrically conductive material.

Figure 5:
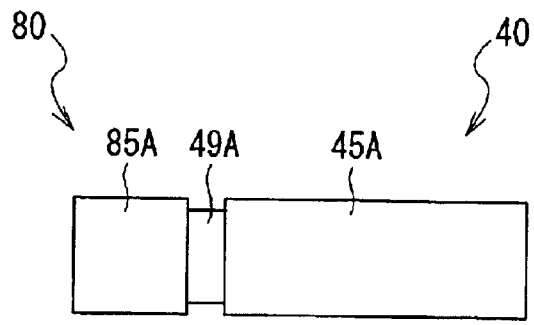
FIG. 5 is a plane view of the first power supply cell shown in FIG. 4.

FIG. 5 shows a plane view of the fifth-layer wiring 45A of the first power supply cell 40 and the fifth-layer wiring 85A of the first pad 80 shown in FIG. 4. The whole surface of the fifth-layer wiring 45A of the first power supply cell 40 and the whole surface of the fifth-layer wiring 85A of the first pad 80 are coated with a metallic film and are electrically connected with each other via the conductive layer 49A. That is, the fifth-layer wiring 45A of the first power supply cell 40 and the fifth-layer wiring 85A of the first pad 80 are at the same potential.

Therefore, when a first potential is applied to the fifth-layer wiring 85A of the first pad 80 via the lead W1, the first potential is applied to the fifth-layer wiring 45A of the first power supply cell 40 via the conductive layer 49A, and then applied to the circuits 20 via a first connecting line 16 as will be described later.

Figure 6:
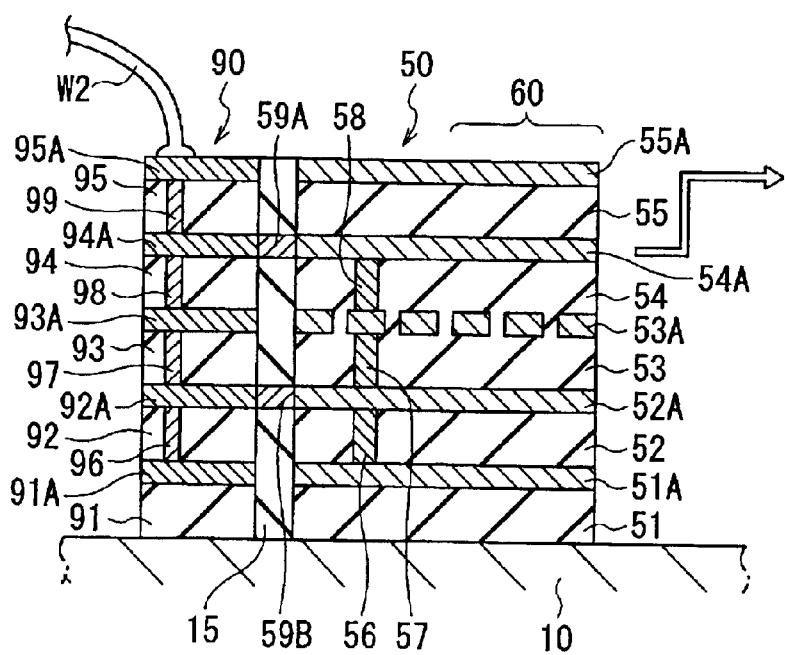
FIG. 6 is a cross sectional view of a second power supply cell in the IO region of the semiconductor device shown in FIG. 1.

FIG. 6 shows a cross sectional view of the second power supply cell 50. Like the first power supply cell 40, the second power supply cell 50 has a five-layer structure with a first layer 51, a second layer 52, a third layer 53, a fourth layer 54 and a fifth layer 55 in order from the semiconductor substrate 10. Each of the layers 51 to 55 is made of an insulating material such as $SiO_2$. On the first layer 51, the second layer 52, the third layer 53, the fourth layer 54 and the fifth layer 55, a first-layer wiring 51A, a second-layer wiring 52A, a third-layer wiring 53A, a fourth-layer wiring 54A and a fifth-layer wiring 55A, each of which is made of an electrically conductive material such as Al, are formed, respectively.

In the second layer 52, a contact 56 is formed to connect the first-layer wiring 51A with the second-layer wiring 52A. Likewise, in the third layer 53, a contact 57 is formed to connect the second-layer wiring 52A with the third-layer wiring 53A, and in the fourth layer 54, a contact 58 is formed to connect the third-layer wiring 53A with the fourth-layer wiring 54A. The contacts 56 to 58 are made of an electrically conductive material such as Al. That is, the first-layer wiring 51A, the second-layer wiring 52A, the third-layer wiring 63A and the fourth-layer wiring 54A are at the same potential.

Like the second power supply cell 50, the second pad 90 has a five-layer structure with a first layer 91, a second layer 92, a third layer 93, a fourth layer 94 and a fifth layer 95 in order from the semiconductor substrate 10. Each of the layers 91 to 95 is made of an insulating material such as $SiO_2$. On the first layer 91, the second layer 92, the third layer 93, the fourth layer 94 and the fifth layer 95, a first-layer wiring 91A, a second-layer wiring 92A, a third-layer wiring 93A, a fourth-layer wiring 94A and a fifth-layer wiring 95A, each of which is made of an electrically conductive material such as Al, are formed, respectively. On the top surface of the fifth-layer wiring 95A, a lead W2 of, for example, Au for connecting with an external device (not shown) is fixed.

In the second layer 92 of the second pad 90, a contact 96 is formed to connect the first-layer wiring 91A with the second-layer wiring 92A, and in the third layer 93, a contact 97 is formed to connect the second-layer wiring 92A with the third-layer wiring 93A. In the fourth layer 94, a contact 98 is formed to connect the third-layer wiring 93A with the fourth-layer wiring 94A, and in the fifth layer 95, a contact 99 is formed to connect the fourth-layer wiring 94A with the fifth-layer wiring 95A. The contacts 96 to 99 are made of an electrically conductive material such as Al. That is, the first-layer wiring 91A to the fifth-layer wiring 95A are at the same potential.

The insulator 15 is provided between the second power supply cell 50 and the second pad 90. The fourth-layer wiring 54 of the second power supply cell 50 and the fourth-layer wiring 94A of the second pad 90 come into contact with each other via a conductive layer 59A of electrically conductive material. That is, the fourth-layer wiring 54A of the second power supply cell 50 and the fourth-layer wiring 94A of the second pad 90 are at the same potential. A plane view of the fourth-layer wiring 54A of the second power supply cell 50 and the fourth-layer wiring 94A of the second pad 90 are the same as that of the fifth-layer wiring 45A of the first power supply cell 40 and the fifth-layer wiring 85A of first pad 80 shown in FIG. 5. Further, the second-layer wiring 52A of the second power supply cell 50 are connected with the second-layer wiring 92A of the second pad 90 via a conductive layer 59B of electrically conductive material.

Figure 7:
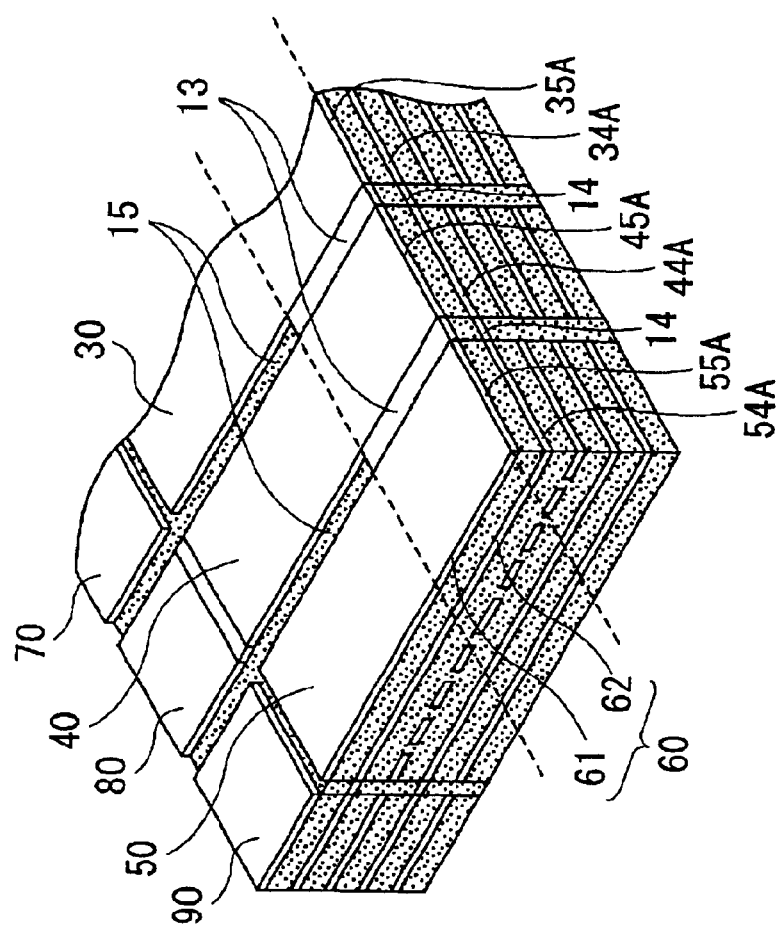
FIG. 7 is a perspective view of each of the cells in the IO region of the semiconductor device shown in FIG. 1.

Therefore, when a second potential is applied to the fifth-layer wiring 95A of the second pad 90 via the lead W2, the second potential is applied to the fourth-layer wiring 64 of the second power supply cell 50 via the fourth-layer wiring 94A of the second pad 90 and the conductive layer 59A, and then applied to the circuits 20 via a second connecting line 17 as will be described later. FIG. 7 shows a perspective view for explaining a connecting structure in the IO region 11. The insulator 15 of an insulating material is provided between the signal cell 30 and the first power supply cell 40, between the first power supply cell 40 and the second power supply cell 50, and between the second power supply cell 50 and the signal cell 30.

In the insulator 15, a conductive layer 13 of electrically conductive material is formed between the fifth layer 35A of the signal cell 30 and the fifth layer 45A of the first power supply cell 40 to electrically connect the fifth layer 35A and the fifth layer 45A with each other. Likewise, the conductive layer 13 of electrically conductive material is formed between the fifth layer 45A of the first power supply cell 40 and the fifth layer 55A of the second power supply cell 50 to electrically connect the fifth layer 45A and the fifth layer 55A with each other. Further, the conductive layer 13 of electrically conductive material, which is not shown in the drawing, is formed between the fifth layer 55A of the second power supply cell 50 and the fifth layer 35A of the signal cell 30 to electrically connect the fifth layer 55A and the fifth layer 35A with each other.

Further, in the insulator 15, a conductive layer 14 of electrically conductive material is formed between the fourth layer 34A of the signal cell 30 and the fourth layer 44A of the first power supply cell 40 to electrically connect the fourth layer 34A and the fourth layer 44A with each other. Likewise, the conductive layer 14 of electrically conductive material is formed between the fourth layer 44A of the first power supply cell 40 and the fourth layer 54A of the second power supply cell 50 to electrically connect the fourth layer 44A and the fifth layer 54A with each other. Further, the conductive layer 14 of electrically conductive material, which is not shown in the drawing, is formed between the fourth layer 54A of the second power supply cell 50 and the fourth layer 34A of the signal cell 30 to electrically connect the fourth layer 54A and the fourth layer 34A with each other. The conductive layers 13 and 14 have predetermined lengths with respect to the internal edge of the IO region 11 (the side of a chip core region 18).

By the conductive layer 13, a layer (a top layer 61), where the fifth layer 35A of the signal cell 30, the fifth layer 45A of the first power supply cell 40, and the fifth layer 65A of the second power supply cell 50 are at the same potential, is formed. Likewise, by the conductive layer 14, a layer (a bottom layer 62), where the fourth layer 34A of the signal cell 30, the fourth layer 44A of the first power supply cell 40, and the fourth layer 54A of the second power supply cell 50 are at the same potential, is formed, Therefore, in the IO region 11, a ring wiring 60 of a laminated structure with the top layer 61 and the bottom layer 62 is formed. By connecting the first connecting line 16 and the second connecting line 17, as will be described later, with the top layer 61 and the bottom layer 62 of the ring wiring 60, respectively, wiring for power supply can be easily carried out. The ring wiring 60 corresponds to a specific example of "power supply wiring" in the invention. Further, the top layer 61 of the ring wiring 60 corresponds to a specific example of a "first power supply layer" in the invention, and the bottom layer 62 corresponds to a specific example of a "second power supply layer" in the invention.

As shown in FIG. 2, in a corner portion of the semiconductor substrate 10, a corner block 12 of a square plane shape is provided. On the corner block 12, a portion of the ring wiring 60 where an extending direction of the ring wiring 60 is changed is formed. For example, in FIG. 2, the ring wiring 60 extending along the edge of the semiconductor substrate 10 in the left of the drawing changes the extending direction on the corner block 12, and the ring wiring 60 extends along the edge of the semiconductor substrate 10 in the bottom of the drawing.

Figure 8:
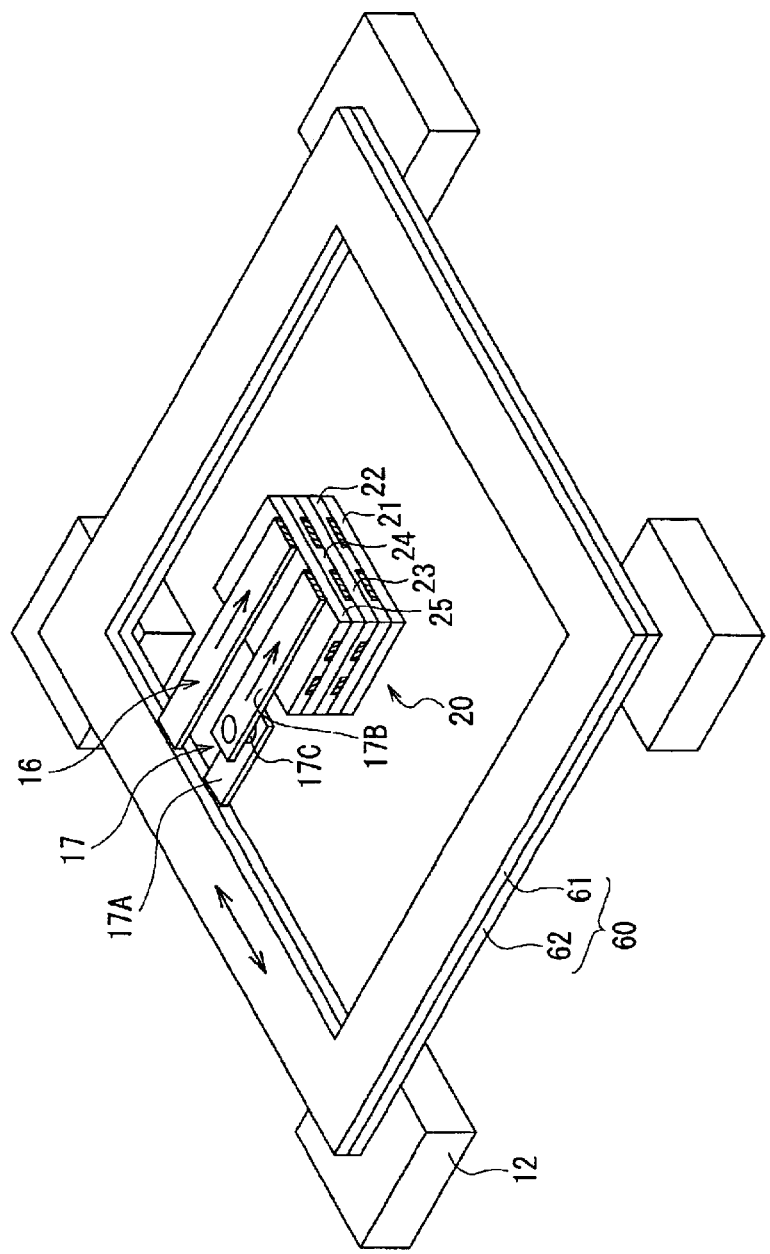
FIG. 8 is a schematic perspective view of a connecting structure between a ring wiring and a circuit in the IO region of the semiconductor shown in FIG. 1.

FIG. 8 schematically shows a structure for connecting the ring wiring 60 with the circuits 20. The circuit 20 has a five-layer structure, and a wiring portion formed on the uppermost layer of the circuit 20, which is fifth layer 25, is at the same level as the top layer 61 of the ring wiring 60. Between the ring wiring 60 and the circuit 20, the first connecting line 16 and the second connecting line 17 are provided. The first connecting line 16 and the second connecting line 17 extend in parallel with each other from the top layer 61 and the bottom layer 62, respectively. In FIG. 8, for the sake of simplification, only one circuit 20 and only one combination of the first connecting line 16 and the second connecting line 17 are shown.

The first connecting line 16 is formed so as to be at the same level as the top layer 61 of the ring wiring 60, and so as to extend to the fifth layer 25 of the circuit 20 while keeping the level. On the other hand, the second connecting line 17 has a first portion 17A extending from the bottom layer 62 of the ring wiring 60 at the same level as the bottom layer 62, and a second portion 17B extending to the circuit 20 at the same level as the top layer 61. The first portion 17A and the second portion 17B in the second connecting line 17 are connected by a contact 17C.

Figure 9:
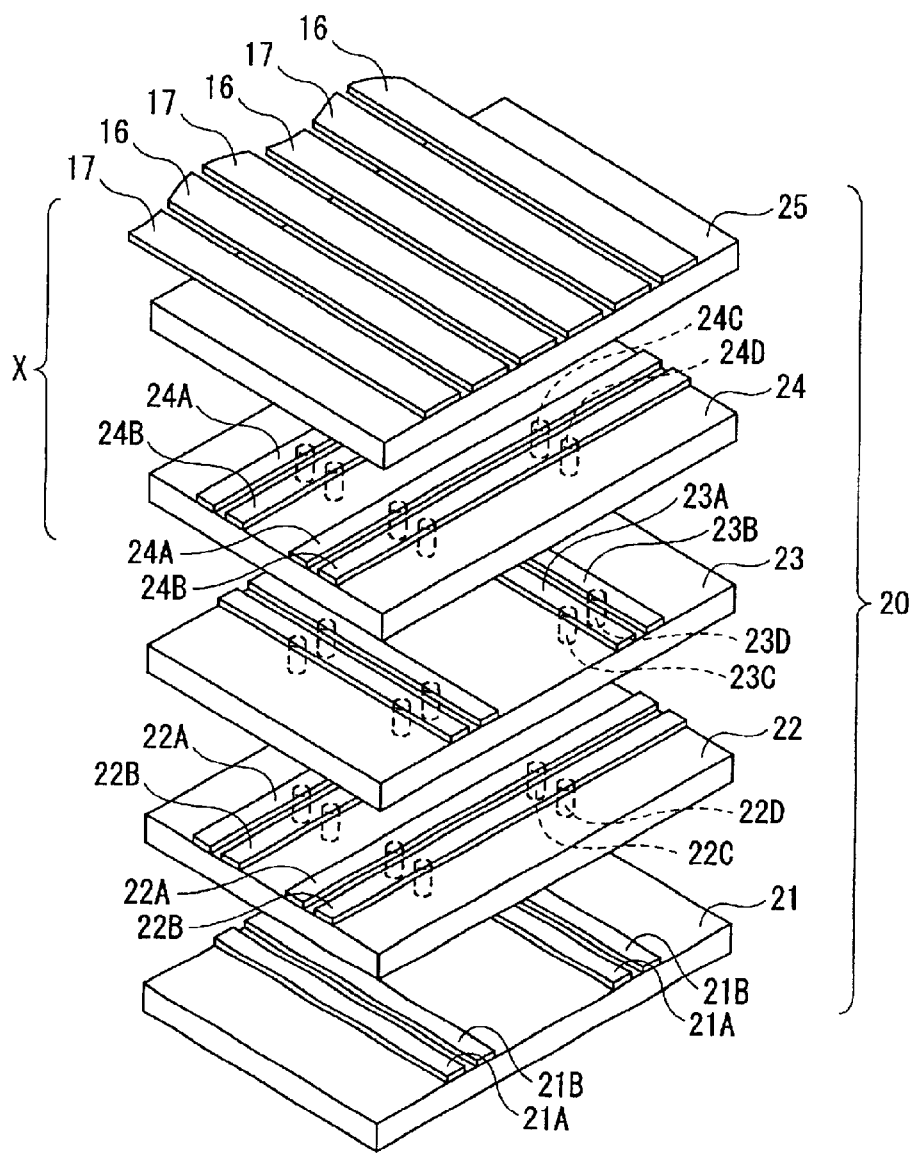
FIG. 9 is an exploded perspective view of internal wirings of the circuit in the semiconductor device shown in FIG. 1.

FIG. 9 shows an exploded perspective view of a structure for connecting the first connecting lines 16, the second connecting lines 17 and the circuit 20. As shown in FIG. 9, the circuit 20 has a first layer 21, a second layer 22, a third layer 23, a fourth layer 24 and a fifth layer 25 in order from the substrate 10. The first layer 21 to the fifth layer 25 are made of an insulating material such as $SiO_2$. On the first layer 21, first-layer wirings 21A and 21B extending in parallel with each other are formed. On the second layer 22, second-layer wirings 22A and 22B extending in parallel with each other and in a direction orthogonal to the first-layer wirings 21A and 21B are formed. On the third layer 23, third-layer wirings 23A and 23B extending in parallel with each other and in a direction orthogonal to the second-layer wirings 22A and 22B are formed, and on the fourth layer 24, fourth-layer wirings 24A and 24B extending in parallel with each other and in a direction orthogonal to the third-layer wirings 23A and 23B are formed. On the fifth layer 25, the first connecting lines 16 and second connecting lines 17 are formed, and the extending directions of the first connecting lines 16 and the second connecting lines 17 are orthogonal to the fourth-layer wirings 24A and 24B.

In the second layer 22, contacts 22C for connecting the first-layer wiring 21A with the second-layer wiring 22A and contacts 22D for connecting the first-layer wiring 21B with the second-layer wiring 22B are formed. In the third layer 23, contacts 23C for connecting the second-layer wiring 22A with the third-layer wiring 23A, and contacts 23D for connecting the second-layer wiring 22B with the third-layer wiring 23B are formed. In the fourth layer 24, contacts 24C for connecting the third-layer wiring 23A with the fourth-layer wiring 24A, and contacts 24D for connecting the third-layer wiring 23B with the fourth-layer wiring 24B.

Figure 10:
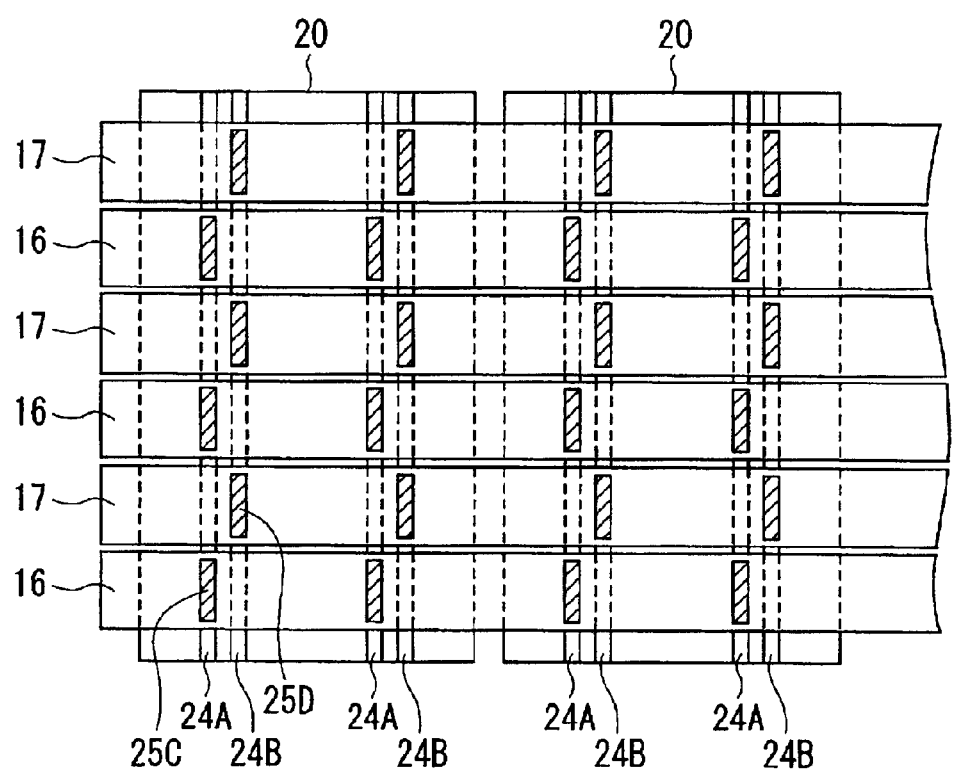
FIG. 10 is a plane view of a state of connection between the circuits Al and connecting lines in the semiconductor device shown in FIG. 1.
Figure 11:
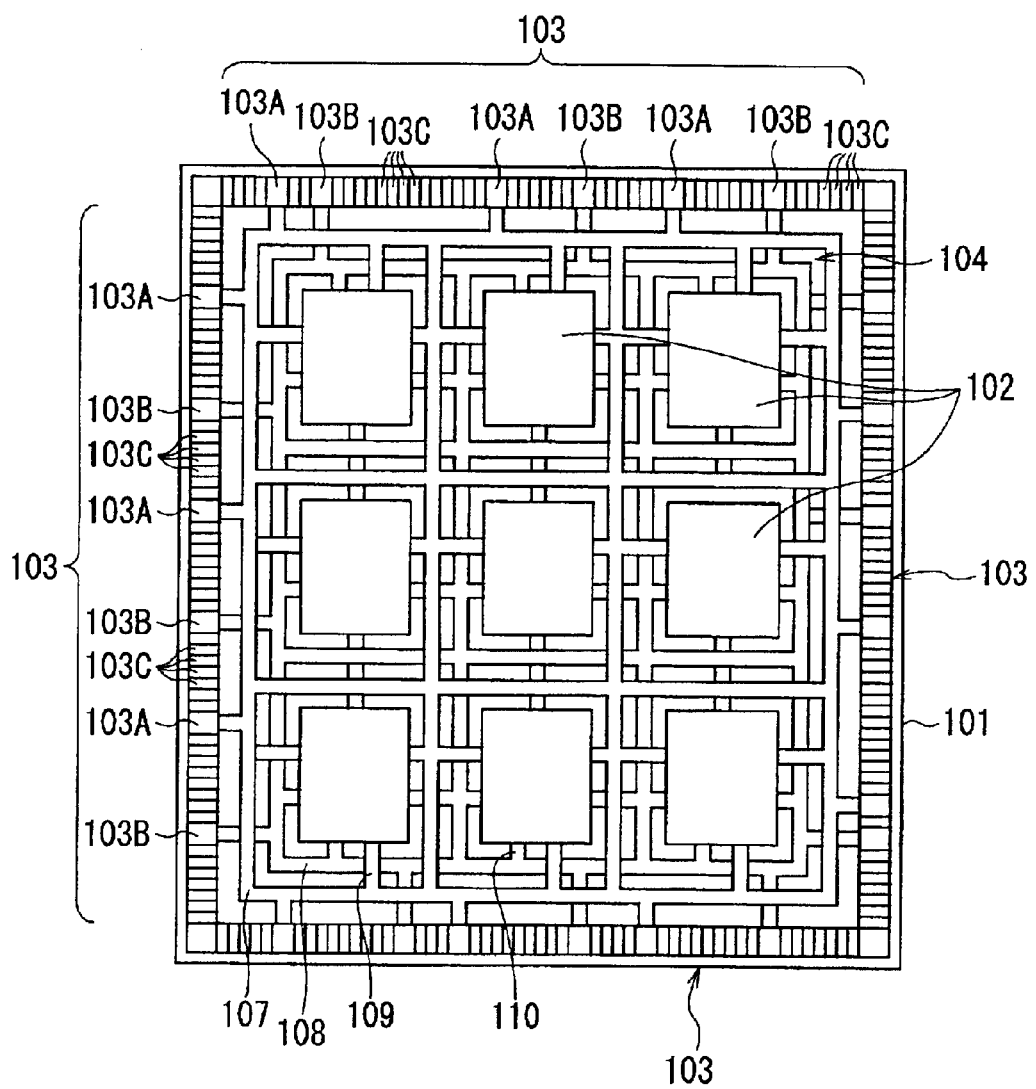
FIG. 11 is a plane view of a conventional semiconductor device.
Figure 12:
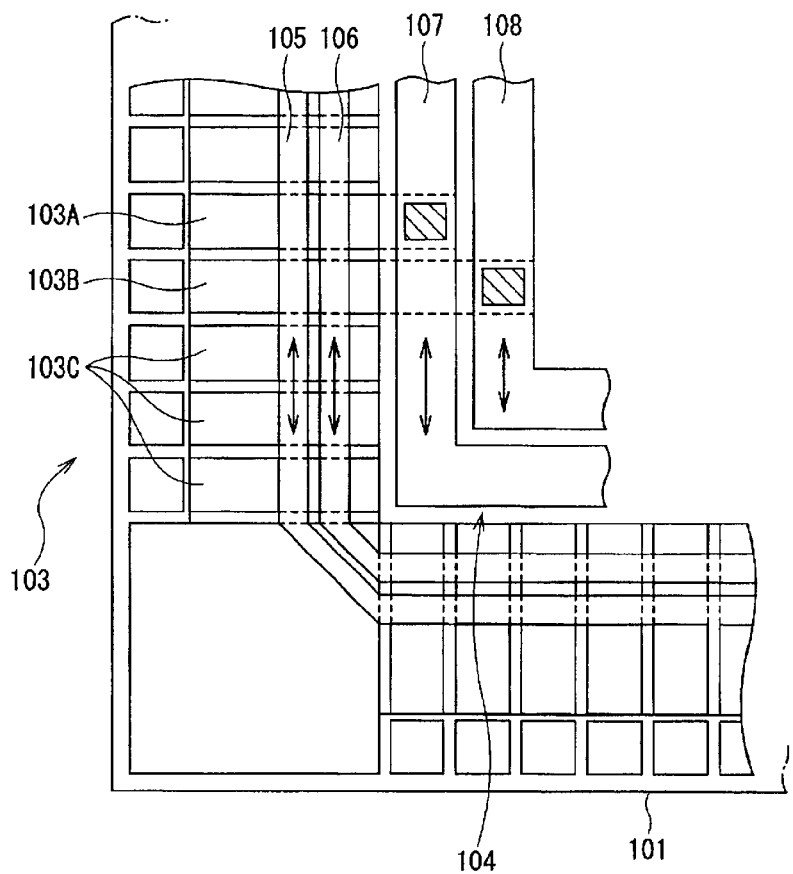
FIG. 12 is an enlarged plane view of a main portion of the conventional semiconductor device shown in FIG. 11.

FIG. 10 shows a plane view of a connecting structure in a region indicated with a symbol X in FIG. 9. As shown in FIG. 10, in the fifth layers 25, contacts 25C for connecting the first connecting lines 16 with the fourth-layer wiring 24A, and contacts 25D for connecting the second connecting lines 17 with the fourth-layer wiring 24B are formed. The contacts 22C, 22D, 23C, 23D, 24C, 24D, 25C and 25D in the circuits 20 are made of an electrically conductive material such as Al. Thereby, the first-layer wiring 21A, the second-layer wiring 22A, the third-layer wiring 23A and the fourth-layer wiring 24A are at the same potential as the first connecting lines 16. Further, the first-layer wiring 21B, the second-layer wiring 22B, the third-layer wiring 23B and the fourth-layer wiring 24B are at the same potential as the second connecting lines 17. That is, the first potential applied via the first connecting lines 16 is applied to the fourth-layer wiring 24A, the third-layer wiring 23A, the second-layer wiring 22A and the first-layer wiring 21A. The second potential applied via the second connecting lines 17 is applied to the fourth-layer wiring 24B, the third-layer wiring 23B, the second-layer wiring 22B and the first-layer wiring 21B.

<Functions of Semiconductor Device>

Next, functions of the semiconductor 1 according to the embodiment of the invention will be described. The leads W1 and W2 (refer to FIG. 4 and FIG. 6) made of, for example, Au are connected with the first pads 80 and the second pads 90 in the semiconductor device 1, respectively. Thereby, electric power can be supplied to the first power supply cells 40 and the second power supply cells 50.

As shown in FIG. 4, the first potential is applied to the fifth-layer wiring 85A of the first pad 80 via the lead W1. As the fifth-layer wiring 85A of the first pad 80, the fifth-layer wiring 45A of the first power supply cell 40, the top layer 61 of the ring wiring 60, and the first connecting lines 16 are at the same potential, the first potential is applied to the first connecting lines 16. Further, as shown in FIG. 9, the first-layer wiring 21A, the second-layer wiring 22A, the third-layer wiring 23A and the fourth-layer wiring 24A in the circuit 20 are at the same potential as the first connecting lines 16, so the first potential is applied to the first-layer wiring 21A through the fourth-layer wiring 24A.

As shown in FIG. 6, the second potential is applied to the fifth-layer wiring 95A of the second pad 90 via the lead W2. The fifth-layer wiring 95A of the second pad 90, the fourth-layer wiring 94A of the second pad 90, the fourth-layer wiring 54A of the second power supply cell 50, and the second connecting lines 17 are at the same potential, so the second potential is applied to the second connecting lines 17. Further, as shown in FIG. 9, the first-layer wiring 21B, the second-layer wiring 22B, the third-layer wiring 23B and the fourth-layer wiring 24B in the circuit 20 are at the same potential as the second connecting lines 17, so the second potential is also applied to the first-layer wiring 21B through the fourth-layer wiring 24B.

Thus, the first potential is applied to the first-layer wiring 21A through the fourth-layer wiring 24A in the circuit 20, and the second potential is applied to the first-layer wiring 21B through the fourth-layer wiring 24B. Thereby, electric power is supplied to each layer in the circuit 20.

In the first power supply cell 40 shown in FIG. 4, the fifth-layer wiring 45A, the third-layer wiring 43A, the second-layer wiring 42A and the first-layer wiring 41A in the first power supply cell 40 are at the same potential, so the first potential is applied to the third-layer wiring 43A, the second-layer wiring 42A and the first-layer wiring 41A. Further, in the second power supply cell 50 shown in FIG. 6, the fourth-layer wiring 54A, the third-layer wiring 53A, the second-layer wiring 52A and the first-layer wiring 51A in the second power supply cell 50 are at the same potential, so the second potential is applied to the third-layer wiring 53A, the second-layer wiring 52A and the first-layer wiring 51A. Thereby, electric power is supplied to portions where electric power is required in the first power supply cell 40 and the second power supply cell 50.

As described above, according to the embodiment of the invention, the ring wiring 60 of a laminated structure with the top layer 61 supplying the first potential and the bottom layer 62 supplying the second potential is provided, so each area of the top layer 61 and the bottom layer 62 can be sufficiently expanded. Thus, electric power which can be supplied by the top layer 61 and the bottom layer 62 in the ring wiring 60 can be sufficiently increased, so no additional ring wiring is required to be provided in the chip core region 18. Consequently, the packing density of the circuits 20 in the chip core region 18 can be improved, which leads to downsizing and higher integration of the semiconductor device 1.

Further, compared with a case where an additional ring wiring is provided in the chip core region 18, a power supply path in the semiconductor device according to the embodiment of the invention can be shortened, so a voltage drop can be prevented, and consequently a deterioration in the circuit characteristics can be prevented. Moreover, as no additional ring wiring is required to be provided in the chip core region 18, flexibility in wiring design can be increased.

Further, as the ring wiring 60 has a shape so as to be arranged around the chip core region 18, the first connecting lines 16 and the second connecting lines 17 can be extended from anywhere in the ring wiring 60. Therefore, the flexibility in the wiring design can be further increased.

Further, the first connecting lines 16 and the second connecting lines 17 are provided on the fifth layers 25 of the circuits 20, so the power supply path can be further shortened, and consequently, a voltage drop can be further prevented.

The invention has been described by exemplifying the embodiment, although the invention is not limited to the embodiment, but is applicable for various modifications. For example, the first power supply cells 40, the second power supply cells 50 and the circuits 20 may have not only a five-layer structure but also a laminated structure with any number of layers.

As described above, according the semiconductor device of the invention, the power supply wiring of a laminated structure with the first power supply layer and the second power supply layer are provided, so each cross-sectional area of the power supply layers can be sufficiently expanded. Therefore, no additional trunk is required to be provided in the first region, so downsizing and higher integration of the semiconductor device can be achieved. Further, as no additional trunk is required to be provided in the first region, the flexibility in wiring design can be increased. Also, the power supply path can be shortened, so a voltage drop can be prevented, and consequently a deterioration in the circuit characteristics can be prevented.

More specifically, in the semiconductor device according to an aspect of the invention, the power supply wiring is arranged around the first region, so connecting lines can be connected with any portion of the power supply wiring. Therefore, flexibility in wiring design can be further increased.

Further, in the semiconductor device according another aspect of the invention, the first connecting lines and the second connecting lines are provided on one layer of each of the circuits, and the branch lines of the first connecting lines and the branch lines of the second connecting lines are provided under the layer, so the power supply path can be shortened, and thereby, a voltage drop can be prevented, and consequently a deterioration in the circuit characteristics can be reliably prevented.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a substrate including a first region, and a second region having a ring shape arranged around the first region;
   a circuit provided in the first region of the substrate and having a predetermined function;
   a power supply wiring provided in the second region of the substrate to supply electric power to the circuit, and having a laminated structure with a first power supply layer corresponding to a first potential, and a second power supply layer corresponding to a second potential, and
   a first connecting line and a second connecting line provided over the first region and the second region to electrically connect the power supply wiring with the circuit, and the first connecting line and the second connecting line corresponding to the first potential and the second potential, respectively, wherein the first connecting line and the second connecting line are plural and have branch lines, and the plurality of first connecting lines and the plurality of second connecting lines extend in parallel so as to be at the same level with respect to the substrate in the first region.

2. A semiconductor device according to claim 1, wherein the power supply wiring has a ring shape arranged around the first region on the substrate.

3. A semiconductor device according to claim 1, further comprising:

a signal-transmitting layer to transmit signals between the circuit and an external device.

4. A semiconductor device according to claim 1, wherein the circuit has a laminated structure with a plurality of layers, the first connecting lines and the second connecting lines are provided on one layer among the plurality of layers, and the branch lines of the first connecting lines and branch lines of the second connecting lines are provided under the one layer among the plurality of layers.

5. A semiconductor device according to claim 1, wherein the first connecting lines and the second connecting lines are located orthogonal to branch lines of the first connecting lines and branch lines of the second connecting lines.

6. A semiconductor device according to claim 1, wherein the power supply wiring includes a first input portion for supplying the first potential to the first power supply layer, and a second input portion for supplying the second potential to the second power supply layer.

* * * * *